(12) United States Patent
Foote

(10) Patent No.: US 8,257,119 B2
(45) Date of Patent: Sep. 4, 2012

(54) SYSTEMS AND METHODS FOR AFFIXING A SILICON DEVICE TO A SUPPORT STRUCTURE

(75) Inventor: Steven A. Foote, Issaquah, WA (US)

(73) Assignee: Honeywell International, Morristown, NJ (US)

( * ) Notice: Subject to any disclaimer, the term of this patent is extended or adjusted under 35 U.S.C. 154(b) by 754 days.

(21) Appl. No.: 12/340,133

(22) Filed: Dec. 19, 2008

(65) Prior Publication Data

US 2010/0157562 A1 Jun. 24, 2010

(51) Int. Cl.
*H01R 11/14* (2006.01)
(52) U.S. Cl. .................................... 439/776
(58) Field of Classification Search .......... 361/776, 361/492–496, 76.2
See application file for complete search history.

(56) References Cited

U.S. PATENT DOCUMENTS

| | | | |
|---|---|---|---|
| 1,198,001 A | 9/1916 | Best | |
| 4,714,436 A * | 12/1987 | Jones | 439/497 |
| 4,902,236 A * | 2/1990 | Hasircoglu | 439/77 |
| 5,299,939 A | 4/1994 | Walker | |
| 5,759,053 A * | 6/1998 | Sugiyama | 439/212 |
| 5,795,424 A * | 8/1998 | Johnson et al. | 156/166 |
| 6,336,269 B1 | 1/2002 | Eldridge et al. | |
| 6,359,770 B1 * | 3/2002 | Kolody et al. | 361/626 |
| 6,768,196 B2 | 7/2004 | Harney et al. | |
| 6,778,406 B2 | 8/2004 | Grube et al. | |
| 6,791,171 B2 | 9/2004 | Mok et al. | |
| 6,835,898 B2 | 12/2004 | Eldridge et al. | |
| 6,875,029 B2 * | 4/2005 | Kawabata et al. | 439/76.2 |
| 6,946,742 B2 | 9/2005 | Karpman | |
| 7,166,911 B2 | 1/2007 | Karpman et al. | |
| 7,232,334 B2 * | 6/2007 | Shimizu et al. | 439/496 |
| 7,247,035 B2 | 7/2007 | Mok et al. | |
| 7,253,566 B2 | 8/2007 | Lys et al. | |
| 7,327,098 B2 | 2/2008 | Chen | |
| 7,358,929 B2 | 4/2008 | Mueller et al. | |
| 7,509,508 B2 * | 3/2009 | Chen | 713/300 |
| 7,511,967 B2 * | 3/2009 | Loda | 361/790 |
| 7,573,274 B2 * | 8/2009 | Aratani | 324/713 |
| 2002/0093089 A1 | 7/2002 | Lu et al. | |
| 2002/0097952 A1 | 7/2002 | Jin et al. | |

(Continued)

FOREIGN PATENT DOCUMENTS

EP 0641019 A2 3/1995

(Continued)

OTHER PUBLICATIONS

Dai Nippon Printng Co., Ltd.; DNP Electronic Device, LF-CSP leadframes; pp. 1-3; http://www.dnp.co.jp/semi/e/lead/06.html, printed Jul. 9, 2009.

*Primary Examiner* — Jean F Duverne
(74) *Attorney, Agent, or Firm* — Lowe Graham Jones PLLC

(57) ABSTRACT

A plurality of ribbon suspenders affix a device to a support structure. Each ribbon suspender is defined by a thickness and a width that is greater than the thickness, and has a first connection portion affixed to the support structure, a second connection portion affixed to the device, and a support portion between the first and second connection portions. The support portion is elastic and flexes to accommodate thermal expansion and contraction of the support structure. A first bond affixes the first connection portion to the support structure and a second bond affixes the second connection portion to the device.

13 Claims, 4 Drawing Sheets

U.S. PATENT DOCUMENTS

| | | |
|---|---|---|
| 2002/0146919 A1 | 10/2002 | Cohn |
| 2004/0147056 A1 | 7/2004 | McKinnell et al. |
| 2005/0189622 A1 | 9/2005 | Humpston et al. |
| 2005/0275075 A1 | 12/2005 | Hong et al. |
| 2007/0054515 A1 | 3/2007 | Williams |
| 2007/0195552 A1 | 8/2007 | Park |
| 2008/0094005 A1 | 4/2008 | Rabiner et al. |
| 2008/0137317 A1* | 6/2008 | Worl et al. .................. 361/776 |
| 2009/0096040 A1 | 4/2009 | Morales et al. |

FOREIGN PATENT DOCUMENTS

| | | |
|---|---|---|
| EP | 1760036 A1 | 3/2007 |
| EP | 1944266 A1 | 7/2008 |
| WO | 2006036250 A1 | 4/2006 |

* cited by examiner

SYSTEMS AND METHODS FOR AFFIXING A SILICON DEVICE TO A SUPPORT STRUCTURE

BACKGROUND OF THE INVENTION

Semiconductor device dies are affixed into device packages for protection and for more convenient installation into an end use device. Device packages may be made of any suitable sturdy and resilient material, such as ceramic, glass, or plastic. The semiconductor device die is affixed to its package in a variety of manners, including the use of epoxy, solder, or brazing.

Various semiconductor-based devices are configured to detect physical events and/or cause physical events. Such devices are generally known as a Micro-Electro-Mechanical Systems (MEMS) device. For example, a MEMS gyroscope may be used to determine angular rotation and a MEMS accelerometer may be used to sense linear acceleration. The MEMS gyroscope and accelerometer measure rotation and acceleration, respectively, by measuring movement and/or forces induced in one or more silicon proof masses mechanically coupled to and suspended from a substrate, typically glass, using one or more silicon flexures. As another example, a MEMS motor may be used to induce or sense movement in a rotor.

A number of recesses etched into the substrate of the MEMS device allow selective portions of the silicon structure to move back and forth freely within an interior portion of the MEMS device. A pattern of electrical connectors, also known as metal traces, are formed on the MEMS device substrate to deliver various electrical voltages and signal outputs to and/or from the MEMS device. The MEMS device, after fabrication, may be affixed to a support structure, such as a device package, with electrical connection of the MEMS device bonded to corresponding electrical connections of the support structure.

For example, the support structure may have wire leads or connectors that provide connectivity between the outside surface of the support structure and the metal traces of the MEMS device. A flip chip bonding process affixes the MEMS die to its support structure while bonding of the metal traces of the MEMS device with the wire leads or connectors of the support structure.

Another type of support structure is a leadless chip carrier. After the MEMS die is affixed to the leadless chip carrier, external wire bonds are made to electrically couple connections of the MEMS device with traces on the leadless chip carrier or with connectors to other electrical devices.

MEMS devices may be very sensitive to inducted stresses and/or changes in orientation of the MEMS device components. Very small changes in stress and/or orientation of the working components of the MEMS device may significantly change the signal output of the MEMS device. Accordingly, prior to use in the field, the MEMS device is calibrated. Typically, calibration of the MEMS device is performed at the factory or during a field calibration process. For example, output of a stationary MEMS gyroscope or accelerometer should be null (zero). Accordingly, during the MEMS device calibration process, the output of the stationary MEMS gyroscope and accelerometer is referenced to a null value and/or is electrically compensated to a null output.

Such "hard mounting" of the MEMS die to the support structure results in the MEMS die becoming solidly, or rigidly, affixed to the support structure. Temperature fluctuations of the device package and/or the MEMS causes thermal expansion (during heating) and/or contraction (during cooling) in the support structure. However, since the materials of the device package, the MEMS die, and any bonding material therebetween, are different, the relative amount of expansion and/or retraction will be different for the support structure, the MEMS die, and any bonding material therebetween. This differential expansion and/or differential contraction during a temperature change may induce changes in the orientation and/or stress of the working components of the MEMS device. Such differential expansion and/or differential contraction during a temperature change may result in the MEMS device becoming uncalibrated.

Further, some materials do not return to their original size and/or shape after a temperature cycle. For example, a gold ball bond may be used to affix the MEMS die to the support structure. Because of the ductility of the gold ball bond, a temperature-induced deformation causes a nonelastic deformation of the gold ball bond. Accordingly, after a number of temperature cycles, the gold ball bond does not return to its original pre-deformation form and/or stress. Such nonelastic, hysteresis deformation of the gold ball bond may result in the MEMS device becoming uncalibrated.

Accordingly, it is desirable to isolate the MEMS die from changes in orientation and/or stress that may occur as a result of differential expansion and/or differential contraction during a temperature change, and from hysteresis deformations resulting from temperature cycles. One prior art technique is to dispose an isolating structure between the MEMS die and the device package. For example, a plate, a pad, or the like made of a relatively thermal expansion resistant material may be bonded to the MEMS die and the device package. However, such intermediate isolating structures may not be entirely effective as movement and or stresses may be transferred through the isolating structure to the MEMS die. Further, such intermediate isolating structures may be relatively complex and expensive to fabricate and install between the MEMS die and the device package.

U.S. application publication 2002/0146919 for the application entitled "Micromachined Springs For Strain Relieved Electrical Connections To IC Chips," to Michael Cohn and filed on Dec. 31, 2001 (which is incorporated herein by reference in its entirety), illustrates an exemplary system to alleviate the effects differential expansion and/or differential contraction during a temperature change, and from hysteresis deformations resulting from temperature cycles. However, the Cohn system is extremely complex since it is made during device fabrication, and employs overplating of a series of metals to provide spring properties.

U.S. application publication 2004/0147056 for the application entitled "Micro-Fabricated Device and Method of Making," to James McKinnell et al. and filed on Jan. 29, 2003 (which is incorporated herein by reference in its entirety), illustrates another exemplary system to alleviate the effects of differential expansion and/or differential contraction during a temperature cycle. However, the McKinnell thermal isolating structure has a very complex shape and a specific length requirement. Accordingly, the McKinnell thermal isolating structure is relatively difficult to form and to place in its installed position between the micro-fabricated device and the device substrate.

SUMMARY OF THE INVENTION

Systems and methods of affixing a silicone device to a support structure using ribbon suspenders are disclosed. Each ribbon suspender is defined by a thickness and a width that is greater than the thickness, and has a first connection portion affixed to the support structure, a second connection portion affixed to the device, and a support portion between the first and second connection portions. The support portion is elastic and flexes to accommodate thermal expansion and contraction of the support structure. A first bond affixes the first connection portion to the support structure and a second bond affixes the second connection portion to the device.

BRIEF DESCRIPTION OF THE DRAWINGS

Preferred and alternative embodiments are described in detail below with reference to the following drawings.

DETAILED DESCRIPTION OF THE PREFERRED EMBODIMENT

Figure 1:
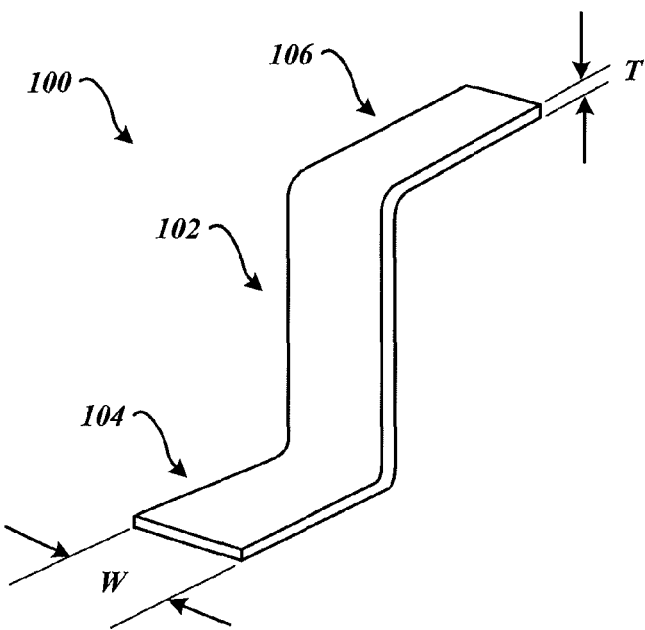
FIG. 1 illustrates an exemplary ribbon suspender embodiment.

FIG. 1 illustrates an exemplary ribbon suspender 100 embodiment. The ribbon suspender 100 comprises a support portion 102, a first connection portion 104 for affixing the ribbon suspender 100 to a support structure, and a second connection portion 106 for affixing the ribbon suspender 100 to a silicone device, such as, but not limited to, a Micro-Electro-Mechanical Systems (MEMS) die.

The ribbon suspender 100 is formed from a ribbon. The ribbon suspender 100 is defined by a thickness "T" and a width "W" (that is greater than the thickness). The width and thickness of the ribbon suspender 100 define the flexure characteristics and suspension characteristics of the ribbon suspender 100. Accordingly, the ribbon suspender 100 isolates the MEMS die from changes in orientation and/or stress that may occur as a result of differential expansion and/or differential contraction during a temperature change, and from hysteresis deformations resulting from temperature cycles.

Figure 2:
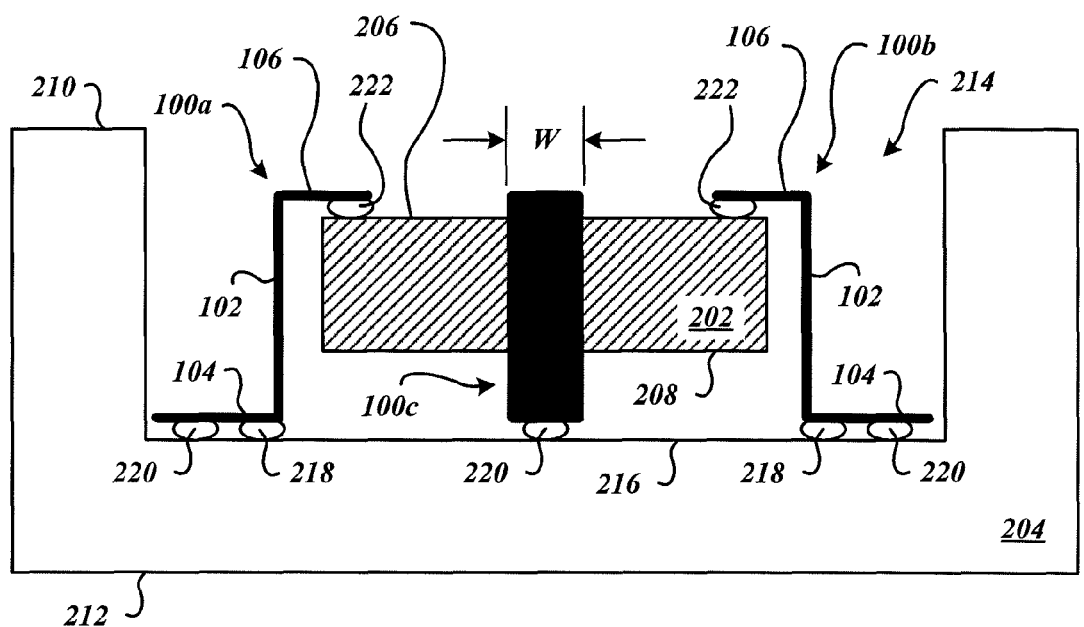
FIG. 2 illustrates a plurality of ribbon suspenders affixing a die to a support structure.
Figure 3:
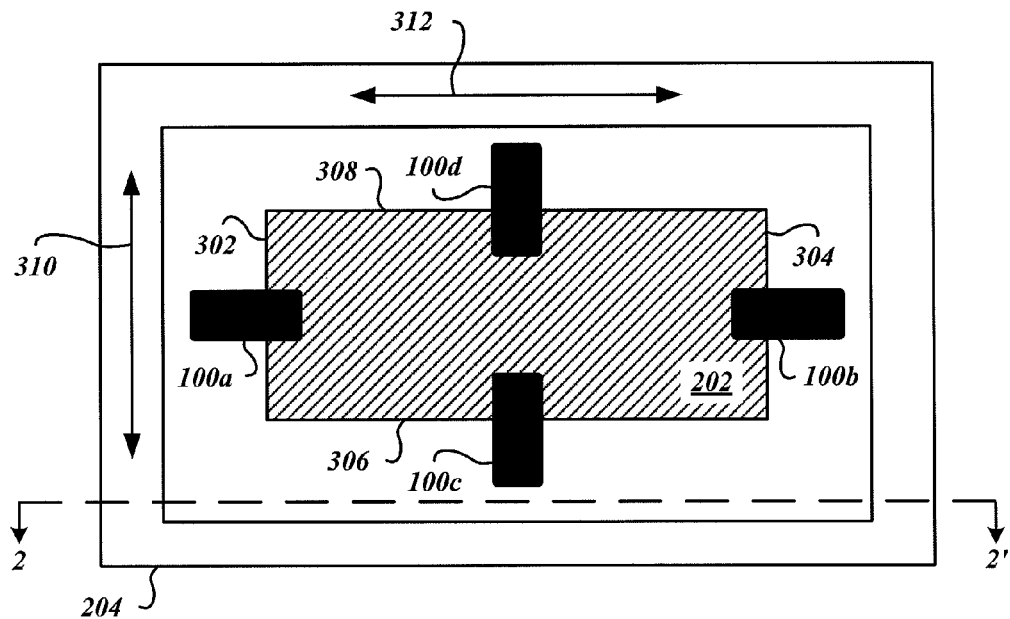
FIG. 3 illustrates the top view of the plurality of ribbon suspenders, the die, and the support structure of FIG. 2.

FIG. 2 illustrates a plurality of ribbon suspenders 100a, 100b, and 100c affixing a MEMS die 202 to a support structure 204. FIG. 3 illustrates the top view of the plurality of ribbon suspenders 100a-100d, the MEMS die 202, and the support structure 204 of FIG. 2.

The support structure 204 may be any suitable structure that the MEMS die 202 is affixed to. For example, the support structure 204 may be a device package in which the MEMS die 202 is affixed within. Another non-limiting example of the support structure 204 is a printed circuit board or the like having a plurality of devices affixed thereon.

The exemplary MEMS die 202 is defined by a top surface 206 and a lower surface 208. The top surface 206 provides a bonding surface for the second connection portion 106 of the ribbon suspenders 100a, 100b. In alternative applications, the lower surface 208 provides a bonding surface for the second connection portion 106 of the ribbon suspender 100.

The support structure 204 is defined by a top surface 210 and a lower surface 212. A cavity 214 in the support structure 204 is configured to receive the MEMS die 202. A lower surface 216 in the cavity 214 provides a bonding surface for the first connection portion 104 of the ribbon suspender 100.

In this exemplary embodiment, a ball bond 218 (alternatively referred to as a stud bump) bonds the first connection portion 104 to the lower surface 216 of the support structure 204. Preferably, the ball bond 218 is located proximate to the junction of the first connection portion 104 and the support portion 102 to enhance stability of the connection of the ribbon suspender 100 to the support structure 204. Additionally, or alternatively, a second ball bond 220 may be used to bond the first connection portion 104 to the lower surface 216 of the support structure 204 to further enhance stability of the connection of the ribbon suspender 100 to the support structure 204.

A ball bond 222 bonds the second connection portion 106 to the top surface 206 of the MEMS die 202. Additionally, a second ball bond (not shown) may be used to further bond the second connection portion 106 to the MEMS die 202 to further enhance stability of the connection of the ribbon suspender 100 to the MEMS die 202.

In the exemplary embodiment illustrated in FIG. 3, the first ribbon suspender 100a is affixed proximate to a first edge 302 of the MEMS die 202. The second ribbon suspender 100b is affixed proximate to a second edge 304 of the MEMS die 202 that opposes the first edge 302 of the MEMS die 202. The third ribbon suspender 100c is affixed proximate to a third edge 306 of the MEMS die 202 that is adjacent to the first edge 302 of the MEMS die 202. And the fourth ribbon suspender 100d is affixed proximate to a fourth edge 308 of the MEMS die 202 that opposes the third side 306 of the MEMS die 202.

A temperature change induces thermal expansion (in response to a temperature increase) or thermal contraction (in response to a temperature decrease) of the support structure 204. Expansion or contraction of the support structure 204 along a first axis, conceptually indicated by the direction arrow 310, does not significantly effect the MEMS die 202 since the two exemplary ribbon suspenders 100a and 100b provide two connection points aligned along an axis perpendicular to the first axis of expansion or contraction. Further, as the material expands or contracts along the illustrated first axis, the ribbon suspenders 100c and 100d will flex, thereby accommodating the thermally induced expansion or contraction.

The temperature change further induces thermal expansion (in response to a temperature increase) or thermal contraction (in response to a temperature decrease) of the support structure 204 along a second axis, conceptually indicated by the direction arrow 312. The expansion or contraction of the support structure 204 along the second axis does not significantly effect the MEMS die 202 since the two exemplary ribbon suspenders 100c and 100d provide two connection points aligned along an axis perpendicular to the second axis of expansion or contraction.

The ribbon suspenders 100a and 100b, and/or the ribbon suspenders 100c and 100d, do not need to be oriented along a common axis perpendicular to the respective axis of expansion or contraction. That is, the ribbon suspenders 100a and 100b, and/or the ribbon suspenders 100c and 100d, may be offset from each other so that they may be affixed to the MEMS die 202 and/or the support structure 204 at convenient locations.

Embodiments of the ribbon suspender 100 were described and illustrated as having the same, or substantially the same, width and thickness as the other ribbon suspenders 100. Different dimensioned ribbon suspenders 100 may be used to affix the MEMS die 202 and the support structure 204 based upon the design needs of a particular application. For example, a wider width ribbon suspender 100 may be used to provide additional support, and/or flexure to accommodate greater amounts of thermal expansion or thermal contraction. Additionally, a wider ribbon suspender 100 will provide a greater resistance to torque forces or stresses. Also, a thicker ribbon suspender 100 will have a lesser degree of flexure in the support portion 102.

Figure 4:
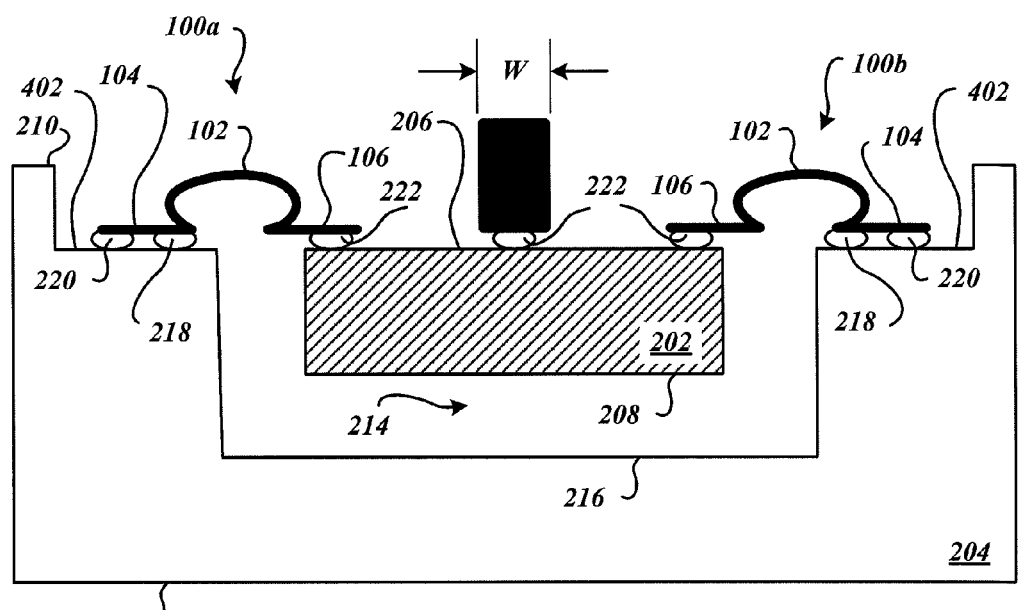
FIG. 4 illustrates an alternative ribbon suspender embodiment.

FIG. 4 illustrates an alternative ribbon suspender 100 embodiment that has a shape that generally corresponds to an "omega" character. In this embodiment, a secondary surface 402 is formed into the support structure 204. The secondary surface 402 may be machined, milled, etched, or formed in any suitable manner. In alternative embodiments, the secondary surface 402 may be omitted, or at least smaller, if the "omega" shaped ribbon suspender 100 is inverted.

Figure 5:
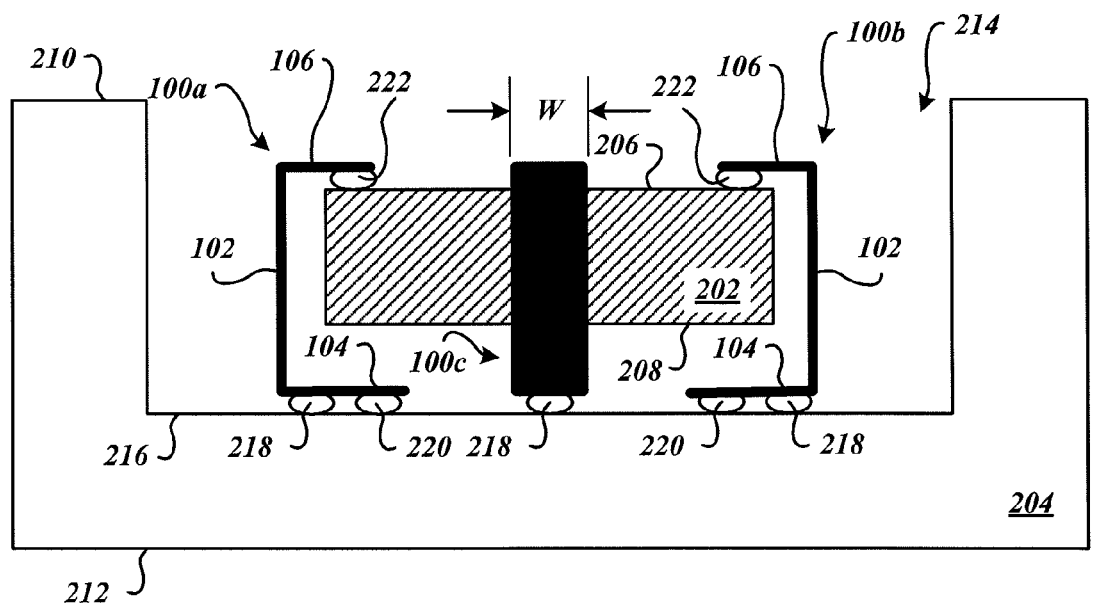
FIG. 5 illustrates another alternative ribbon suspender embodiment.

FIG. 5 illustrates an alternative ribbon suspender 100 embodiment. In this exemplary embodiment, the first connection portion 104 is oriented in an inverted position (as compared to the position of the first connection portion 104 illustrated in FIGS. 1 and 2).

Figure 6:
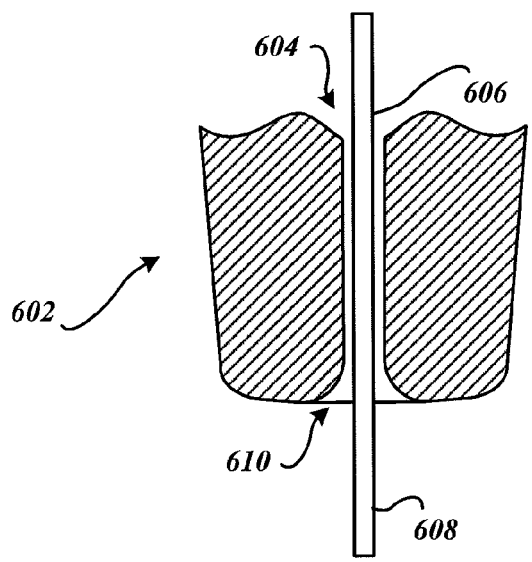
FIG. 6 illustrates an exemplary tool that forms the ribbon suspender.

FIG. 6 illustrates an exemplary tool 602 that is operable to form a ribbon suspender 100. The tool 602 has a capillary 604, generally shaped in accordance with the width and thickness of a ribbon 606 from which a ribbon suspender 100 is formed therefrom. A roll of the ribbon 606 is unwound such that a portion 608 of the ribbon 606 is extended outwardly from a lower end 610 of the tool 602. By appropriate manipulation of the lower end 610 of the tool 602, the portion 608 of the ribbon 606 may be formed in a desired shape. For example, the lower end 610 of the tool 602 may be moved so that the portion 608 of the ribbon 606 is bent, thereby forming, for example, the bend between the first connection portion 104 and the support portion 102. Further extension of the ribbon 606, and a subsequent bending operation, could then form the support portion 102, and then a bend between the support portion 102 and the second connection portion 106.

Figure 7:
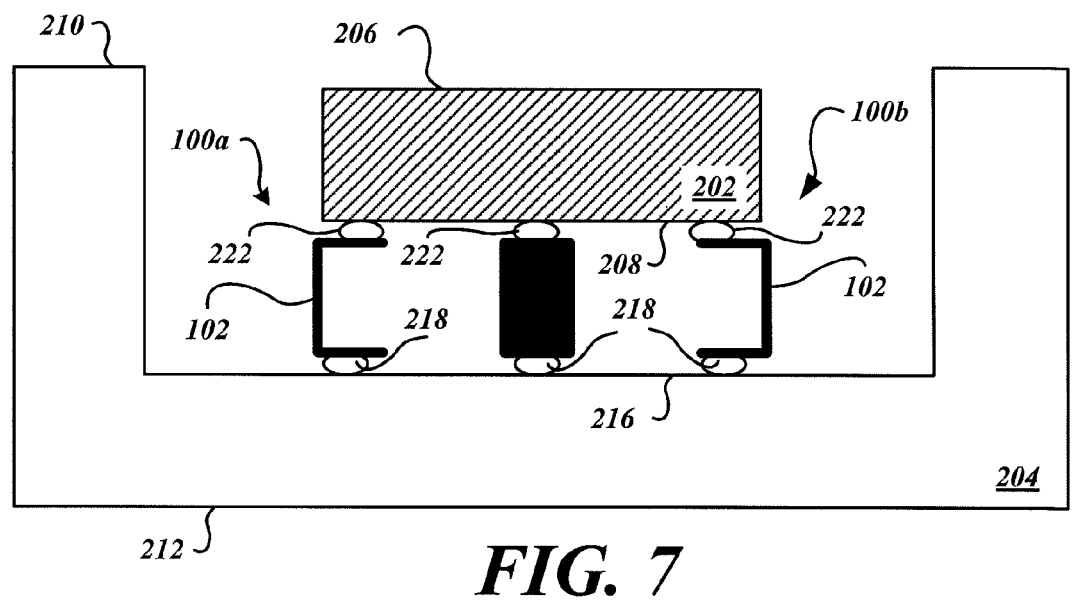
FIG. 7 illustrates another alternative ribbon suspender embodiment.

FIG. 7 illustrates an alternative ribbon suspender 100 embodiment. In this exemplary embodiment, some of the compactness of the ribbon suspender 100 illustrated in FIG. 5 is traded for ease of access with a likelihood of lower cost tooling and producibility.

In the various embodiments, the ribbon suspender 100 is made of a relatively resilient material, such as, but not limited to, a metal. An exemplary embodiment employs a ribbon material made of gold plated Kovar. Kovar is a trademarked nickel-cobalt ferrous alloy designed to be compatible with the thermal expansion characteristics of borosilicate glass (~5× $10^{-6}$/K between 30 and 200° C., to ~10×$10^{-6}$/K at 800° C.). Kovar allows direct mechanical connections over a range of temperatures with minimal thermal expansion. The optional gold plating of the Kovar facilitates mechanical bonding of the ribbon suspender 100 to the MEMS die 202 and the support structure 204. Other metals may be used.

In some applications, the ribbon suspender 100 may also be used to establish an electrical connection between the MEMS die 202 and a connector of the support structure 204. Additionally, or alternatively, conventional wire bonding may be used to electrically bond the connections of the MEMS die 202 and connectors of the support structure 204.

The support provided by a particular ribbon suspender 100 may be selectively designed by defining the thickness, width, and/or material of the ribbon suspender 100. The lateral "stiffness" of the ribbon suspender 100 is a function of the width of the ribbon suspender 100. The lateral stiffness of the ribbon suspender 100 increases as a cube of the width. For example, a relatively wide ribbon suspender 100 will hold the MEMS die 202 more rigidly by the cube of it's width.

Flexure characteristics of the ribbon suspender 100 is controllable by selectively designing the thickness and/or material of the ribbon suspender 100. For example, a relatively thin ribbon suspender 100 will flex easier to allow better isolation of the MEMS die 202.

Design of the width-to-thickness aspect ratio of the ribbon suspender 100 allows great flexural isolation while maintaining rigid support. This feature is significantly enhanced by the cubic relationship of the stiffness to the width or thickness (as applicable).

Position of the MEMS die 202 in the cavity 214 of the support structure 204 is controllable by selectively designing the length of the support portion 102 of the ribbon suspender 100. A gap may be maintained between the lower surface 208 of the MEMS die 202 and a surface 216 of the cavity 214.

Embodiments of the ribbon suspender 100 were described and illustrated as using ball bonds 218, 220, 222 for affixing the first connection portion 104 to the support structure 204 and for affixing the second connection portion 106 to the MEMS die 202. Any suitable material may be used for a ball bond, including other metals such as aluminum or copper, or non-metallic materials such as epoxy. Further, the bonding structure is not limited to ball bonds. For example, a layer of epoxy over a portion of the contact area of the first connection portion 104 and/or the contact area of the second connection portion 106 may be used. In other embodiments, suitable mechanical fasteners may be used, such as, but not limited to, clamps, screws, rivets, or pins.

Any suitable bonding process may be used to affix the first connection portion 104 to the lower surface 216 of the support structure 204, and to affix the second connection portion 106 to the top surface 206 of the MEMS die 202. Bonding balls may be bonded using a thermo compression bonding process or a thermo-ultrasonic bonding process. In some applications, soldering or braising may be used. Further, different types of bonding processes may be used to affix the MEMS die 202 to the support structure 204.

Embodiments of the ribbon suspender 100 were described and illustrated as affixing the support structure 204 and the MEMS die 202. The ribbon suspenders 100 may be used to affix any structure to another structure. For example, two MEMS dies may be affixed to each other using ribbon suspenders 100.

Embodiments of the ribbon suspender 100 were described and illustrated as affixing the MEMS die 202 to the support structure 204. The support structure 204 may be any suitable enclosure. Further, the support structure 204 does not need to be an enclosure. For example, the ribbon suspenders 100 may be used to fasten the MEMS die 202 to a substantially flat, or a machined, substrate that is not an enclosure.

Embodiments of the ribbon suspender 100 may be formed in any suitable shape that is suitable for the application at hand. For example, the support portion 102 may be "U" shaped, arched, triangular, or have multiple bends thereon. In an alternative embodiment, the ribbon material is bent such that the first connection portion 104 and the second connection portion 106 are aligned in different directions.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A device support system, comprising:
   a ribbon suspender defined by a thickness and a width that is greater than the thickness, the ribbon suspender comprising:
      a first connection portion affixed to a support structure;
      a second connection portion affixed to a device; and
      a support portion between the first and second connection portions,
      wherein the portions are formed from a monolithic material;
   a first bond affixing the first connection portion to the support structure;
   a second bond affixing the second connection portion to the device,
   wherein the ribbon suspender is a first ribbon suspender defined by a first thickness and a first width that is greater than the first thickness;
   a second ribbon suspender defined by a second thickness and a second width that is greater than the second thickness;
   a third ribbon suspender defined by a third thickness and a third width that is greater than the third thickness; and
   a fourth ribbon suspender defined by a fourth thickness and a fourth width that is greater than the fourth thickness,
   wherein the second ribbon suspender, third ribbon suspender, fourth ribbon suspender are bonded to the device and the support structure with a respective first bond affixing the respective first connection portion to the support structure and with a respective second bond affixing the respective second connection portion to the device,
   wherein the device is only connected to the support structure using the ribbon suspender.

2. The device support system of claim 1:
   wherein the first ribbon suspender is affixed proximate to a first edge of the device;
   wherein the second ribbon suspender is affixed proximate to a second edge of the device that opposes the first edge of the device;
   wherein the third ribbon suspender is affixed proximate to a third edge of the device that is adjacent to the first edge of the device; and
   wherein the fourth ribbon suspender is affixed proximate to a fourth edge of the device that opposes the third edge of the device.

3. The device support system of claim 2, wherein the widths of the first ribbon suspender, the second ribbon suspender, the third ribbon suspender, and the fourth ribbon suspender are substantially the same.

4. The device support system of claim 3, wherein the first ribbon suspender is aligned with the second ribbon suspender, and wherein the third ribbon suspender is aligned with the fourth ribbon suspender.

5. The device support system of claim 1, wherein the first bond is proximate to a joint between the first connection portion and the support portion, and further comprising:
   a third bond affixing the second connection portion to the support structure, wherein the third bond is proximate to an end of the first connection portion.

6. The device support system of claim 1, wherein the ribbon suspender is a gold-plated Kovar ribbon.

7. The device support system of claim 1, wherein the device is a Micro-Electro-Mechanical Systems (MEMS) die.

8. The device support system of claim 1, wherein the support portion is a leadless chip carrier.

9. The device support system of claim 1, wherein the ribbon suspender, the first bond, and the second bond are electrically conductive, wherein the first bond is electrically coupled to a connection of the support structure, and wherein the second bond is electrically coupled to a connection of the device.

10. The device support system of claim 1, wherein the first bond and the second bond are ball bonds.

11. The device support system of claim 1, wherein the first bond and the second bond are gold ball bonds.

12. The device support system of claim 1, wherein the first bond and the second bond are epoxy bonds.

13. The device support system of claim 1, wherein the support portion is elastic in a first direction, and is inelastic in a second direction corresponding to the width of the ribbon suspender.

* * * * *